(12) United States Patent
Wang

(10) Patent No.: US 11,170,695 B2
(45) Date of Patent: Nov. 9, 2021

(54) SHIFT REGISTER UNIT AND DRIVING METHOD THEREOF, GATE DRIVE CIRCUIT, AND DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventor: Bo Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 790 days.

(21) Appl. No.: 15/777,715

(22) PCT Filed: Oct. 10, 2017

(86) PCT No.: PCT/CN2017/105459
§ 371 (c)(1),
(2) Date: May 21, 2018

(87) PCT Pub. No.: WO2018/153104
PCT Pub. Date: Aug. 30, 2018

(65) Prior Publication Data
US 2021/0174731 A1    Jun. 10, 2021

(30) Foreign Application Priority Data
Feb. 24, 2017   (CN) .......................... 201710106147.2

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ......... G09G 3/2092; G09G 2310/0286; G11C 19/28
See application file for complete search history.

(56) References Cited

U.S. PATENT DOCUMENTS

| 7,120,221 B2 | 10/2006 | Moon |
| 8,422,621 B2 | 4/2013 | Jang et al. |
| (Continued) | | |

FOREIGN PATENT DOCUMENTS

| CN | 102750898 A | 10/2012 |
| CN | 104485086 A | 4/2015 |
| (Continued) | | |

OTHER PUBLICATIONS

Search Report and Written Opinion for International Application No. PCT/CN2017/105459 dated Jan. 11, 2018.

*Primary Examiner* — Alexander Eisen
*Assistant Examiner* — Kebede T Teshome
(74) *Attorney, Agent, or Firm* — Calfee, Halter & Griswold LLP

(57) ABSTRACT

The present disclosure provides a shift register unit, a driving method thereof, a gate drive circuit, and a display device, and relate to the field of display technology. When a user's demand is changed, it is not necessary to regulate a pulse width of a signal inputted to a pixel circuit row by row, and a signal outputted from the shift register unit to the pixel circuit is stable. The shift register unit includes a first input circuit, a first output circuit, a second input circuit, a second output circuit, and a stabilizing circuit. The stabilizing circuit is configured to, when the first output circuit outputs a signal to a signal output terminal, stabilize a potential of a second node so that no signal is outputted from the second (Continued)

output circuit; or, when the second output circuit outputs a signal to the signal output terminal, stabilize a potential of a first node so that no signal is outputted from the first output circuit.

18 Claims, 5 Drawing Sheets

(56) References Cited

U.S. PATENT DOCUMENTS

| | | | |
|---|---|---|---|
| 8,867,697 | B2 | 10/2014 | Jang et al. |
| 9,013,390 | B2 | 4/2015 | Yang et al. |
| 2005/0220262 | A1 | 10/2005 | Moon |
| 2012/0269316 | A1 | 10/2012 | Jang et al. |
| 2013/0027377 | A1* | 1/2013 | Yang ............... G09G 3/3677 345/212 |
| 2013/0243150 | A1 | 9/2013 | Jang et al. |
| 2016/0049126 | A1* | 2/2016 | Zhang ............... G09G 3/3696 345/173 |
| 2016/0372063 | A1 | 12/2016 | Li et al. |

FOREIGN PATENT DOCUMENTS

| | | |
|---|---|---|
| CN | 105609041 A | 5/2016 |
| CN | 105632444 A | 6/2016 |
| CN | 105719599 A | 6/2016 |
| CN | 106782338 A | 5/2017 |
| EP | 3242289 A1 | 11/2017 |

* cited by examiner

SHIFT REGISTER UNIT AND DRIVING METHOD THEREOF, GATE DRIVE CIRCUIT, AND DISPLAY DEVICE

CROSS-REFERENCE TO RELATED APPLICATIONS

The present application is based on International Application No. PCT/CN2017/105459, filed on Oct. 10, 2017, which is based upon and claims priority to Chinese Patent Application No. 201710106147.2 filed on Feb. 24, 2017, and the entire contents of which are incorporated herein by reference in its entirety.

TECHNICAL FIELD

The present disclosure relates to the field of display technology, and more particular, to a shift register unit, a driving method thereof, a gate drive circuit, and a display device.

BACKGROUND

AMOLED (Active Matrix Driving OLED) display devices are increasingly applied in the field of high performance display due to advantages such as low manufacturing costs, high response speed, power-saving, DC drive for portable devices, and a wide range of operating temperature.

Pixel circuits for emitting light are provided in pixels of an AMOLED display panel. However, in a process of viewing a display screen using an AMOLED display, human eyes will have different feelings for different brightnesses of ambient light. For example, when the ambient light is bright, it is necessary to increase brightness of the display so as to make the display screen clearer; and when the ambient light is dark, it is necessary to lower the brightness of the display to avoid the feeling of glare caused by the display screen with a higher brightness. Therefore, users need to adjust the brightness of the display screen depending on different viewing environments.

In this case, when user demand changes, a pulse width of a signal inputted to the foregoing pixel circuit needs to be adjusted row by row in the prior art so as to achieve the purpose of adjusting brightnesses of the pixels, but the row-to-row adjustment process is relatively complex, resulting in reduced production efficiency.

It should be noted that, information disclosed in the above background portion is provided only for better understanding of the background of the present disclosure, and thus it may contain information that does not form the prior art known by those ordinary skilled in the art.

SUMMARY

According to an aspect of the embodiments of the present disclosure, there is provided a shift register unit including a first input circuit connected to a first node and configured to output a potential signal to the first node; a first output circuit connected to a signal output terminal and the first node, and configured to output a potential signal to the signal output terminal under the control of the first node; a second input circuit connected to a second node, and configured to output a potential signal to the second node; a second output circuit connected to the signal output terminal and the second node, and configured to output a potential signal to the signal output terminal under the control of the second node; a stabilizing circuit connected with the first node and the second node, and configured to stabilize a potential of the second node when the first output circuit outputs the potential signal to the signal output terminal such that no signal is outputted from the second output circuit; or the stabilizing circuit is configured to stabilize a potential of the first node when the second output circuit outputs the potential signal to the signal output terminal, such that no signal is outputted from the first output circuit.

In one embodiment, the stabilizing circuit is further connected to a first voltage terminal, and the stabilizing circuit is configured to, under the control of the first node, output a signal of the first voltage terminal to the second node, or, under the control of the second node, output the signal of the first voltage terminal to the first node N1; the stabilizing circuit includes a first transistor and a second transistor, wherein an aspect ratio of the first transistor is greater than an aspect ratio of the second transistor; a gate electrode of the first transistor is connected to the first node, a first electrode of the first transistor is connected to the first voltage terminal, and a second electrode of the first transistor is connected to the second node; a gate electrode of the second transistor is connected to the second node, a first electrode of the second transistor is connected to the first voltage terminal, and a second electrode of the second transistor is connected to the first node.

In one embodiment, the first input circuit is further connected to a signal input terminal, and is configured to, under the control of the signal input terminal, output a potential signal of the signal input terminal to the first node; the first input circuit includes a third transistor, a gate electrode and a first electrode of the third transistor are connected to the signal input terminal, and a second electrode of the third transistor is connected to the first node.

In one embodiment, the first output circuit is further connected to a first clock signal terminal, and is configured to, under the control of the first node, output a signal of the first clock signal terminal to the signal output terminal; the first output circuit includes a fourth transistor, a gate electrode of the fourth transistor is connected to the first node, a first electrode of the fourth transistor is connected to the first clock signal terminal, and a second electrode of the fourth transistor is connected to the signal output terminal.

In one embodiment, the second input circuit is further connected with a second clock signal terminal and a second voltage terminal, and is configured to, under the control of the second clock signal terminal, output a signal of the second voltage terminal to the second node; the second input circuit includes a fifth transistor, a gate electrode of the fifth transistor is connected to the second clock signal terminal, a first electrode of the fifth transistor is connected to the second voltage terminal, and a second electrode of the fifth transistor is connected to the second node.

In one embodiment, the second output circuit is further connected to the first voltage terminal, and is configured to, under the control of the second node, output a signal of the first voltage terminal to the signal output terminal; the second output circuit includes a sixth transistor and a storage capacitor; a gate electrode of the sixth transistor is connected to the second node, a first electrode of the sixth transistor is connected to the first voltage terminal, and a second electrode of the sixth transistor is connected to the signal output terminal; one terminal of the storage capacitor is connected to the first voltage terminal, and the other terminal of the storage capacitor is connected to the second node.

According to another aspect of the embodiments of the present disclosure, there is provided a gate drive circuit including a plurality of cascade connected shift register units according to any one of the above described; a signal input terminal of a first stage shift register unit is connected to an initiating signal terminal; except for the first stage shift register unit, a signal output terminal of a previous stage shift register unit is connected to a signal input terminal of a next stage shift register unit.

According to still another aspect of the embodiments of the present disclosure, there is provided a display device including the gate drive circuit as described above.

According to yet another aspect of the embodiments of the present disclosure, there is provided a method for driving the shift register unit according to any one of the above described, wherein a method for driving the shift register unit in an image frame comprises the following steps: in a first phase, the first input circuit outputs the potential signal to the first node; under the control of the first node, the first output circuit outputs a first signal to the signal output terminal; the potential of the second node is stabilized by the stabilizing circuit so that no signal is outputted from the second output circuit; in a second stage, the first output circuit maintains in an ON-state and outputs a second signal to the signal output terminal; the stabilizing circuit stabilizes the potential of the second node so that no signal is outputted from the second output circuit; in a third stage, the second input circuit outputs the potential signal to the second node; under the control of the second node, the second output circuit outputs the first signal to the signal output terminal; the stabilizing circuit is configured to stabilize the potential of the first node so that no signal is outputted from the first output circuit; the first signal and the second signal are respectively at a high level and a low level or a low level and a high level.

In one embodiment, when the stabilizing circuit is further connected to the first voltage terminal, the stabilizing circuit stabilizing the potential of the first node or the second node includes: under the control of the first node, the stabilizing circuit outputting the signal of the first voltage terminal to the second node; or under the control of the second node, the stabilizing circuit outputting the signal of the first voltage terminal to the first node.

In one embodiment, when the first input circuit is further connected to a signal input terminal, the first input circuit outputting the potential signal to the first node comprises: the first input circuit outputting a signal of the signal input terminal to the first node under the control of the signal input terminal.

In one embodiment, when the first output circuit is further connected to the first clock signal terminal, the first output circuit outputting the potential signal to the signal output terminal comprises: the first output circuit outputting the potential signal of the first clock signal terminal to the signal output terminal under the control of the first node.

In one embodiment, when the second input circuit is further connected with the second clock signal terminal and the second voltage terminal, the second input circuit outputting the signal to the second node comprises: outputting the signal of the second voltage terminal to the second node under the control of the second clock signal terminal.

In one embodiment, when the second output circuit is further connected to the first voltage terminal, the second output circuit outputting a signal to the signal output terminal comprises the second output circuit storing the potential of the second node and outputting the signal of the first voltage terminal to the signal output terminal, under the control of the second node.

In one embodiment, when the stabilizing circuit is further connected to the first voltage terminal, the first input circuit is further connected to the signal input terminal, the first output circuit is further connected to the first clock signal terminal, the second input circuit is further connected to the second clock signal terminal and the second voltage terminal, the second output circuit is further connected to the first voltage terminal; and when the stabilizing circuit comprises the first transistor and the second transistor, the first input circuit comprises the third transistor, the first output circuit comprises the fourth transistor, the second input circuit comprises the fifth transistor, and the second output circuit comprises the sixth transistor and the storage capacitor; and in the case where the above-described transistors are all P-type transistors, the method for driving the shift register unit in an image frame comprises: the second voltage terminal being inputted with a low level, and the first voltage terminal being inputted with a high level; in the first phase, the signal input terminal and the second clock signal terminal are inputted with a low level, and the first clock signal terminal is inputted with a high level; the fourth transistor, the third transistor, the fifth transistor, and the first transistor are turned on, and the remaining transistors are turned off; the signal of the first clock signal terminal is outputted to the signal output terminal through the fourth transistor; in the second phase, the signal input terminal and the second clock signal terminal are inputted with a high level, and the first clock signal terminal is inputted with a low level; the fourth transistor and the first transistor are turned on, and the remaining transistors are turned off; the signal of the first clock signal terminal is outputted to the signal output terminal through the fourth transistor; in the third phase, the signal input terminal and the first clock signal terminal are inputted with a high level, and the second clock signal terminal is inputted with a low level; the fifth transistor, the second transistor, and the sixth transistor are turned on, and the remaining transistors are turned off; the signal of the first voltage terminal is outputted to the signal output terminal through the sixth transistor.

The embodiments of the present disclosure provide a shift register unit, a driving method thereof, a gate drive circuit, and a display device. The shift register unit includes a first input circuit, a first output circuit, a second input circuit, a second output circuit, and a stabilizing circuit. The first input circuit is connected to a first node, and is configured to output a signal to the first node. The first output circuit is connected to a signal output terminal and the first node, and is configured to output a signal to the signal output terminal. The second input circuit is connected to a second node, and is configured to output a signal to the second node. The second output circuit is connected to the signal output terminal and the second node, and is configured to output a signal to the signal output terminal. The stabilizing circuit is connected to a first voltage terminal, the first node and the second node, and is configured to, when the first output circuit outputs the signal to the signal output terminal, stabilize a potential of the second node so that no signal is outputted from the second output circuit; or, when the second output circuit outputs the signal to the signal output terminal, the stabilizing circuit is configured to stabilize a potential of the first node so that no signal is outputted from the first output circuit.

BRIEF DESCRIPTION OF THE DRAWINGS

In order to more clearly describe the technical solutions in the embodiments of the present disclosure or in the prior art, the drawings used in the description of the embodiments or the prior art will be briefly described below. Obviously, the drawings in the following description are only some embodiments of the present disclosure, and those skilled in the art can also obtain other drawings based on these drawings without any creative work.

REFERENCE SIGNS

10-stabilizing circuit; 20-first input circuit; 30-first output circuit; 40-second input circuit; 50-second output circuit.

DETAILED DESCRIPTION

The technical solutions in the embodiments of the present disclosure will be clearly and comprehensively described hereinafter with reference to the accompanying drawings in the embodiments of the present disclosure. It is obvious that the described embodiments are merely a part of the embodiments of the present disclosure, but not all of the embodiments. All other embodiments obtained by a person of ordinary skill in the art based on the embodiments of the present disclosure without creative efforts shall fall within the protection scope of the present disclosure.

Figure 1:
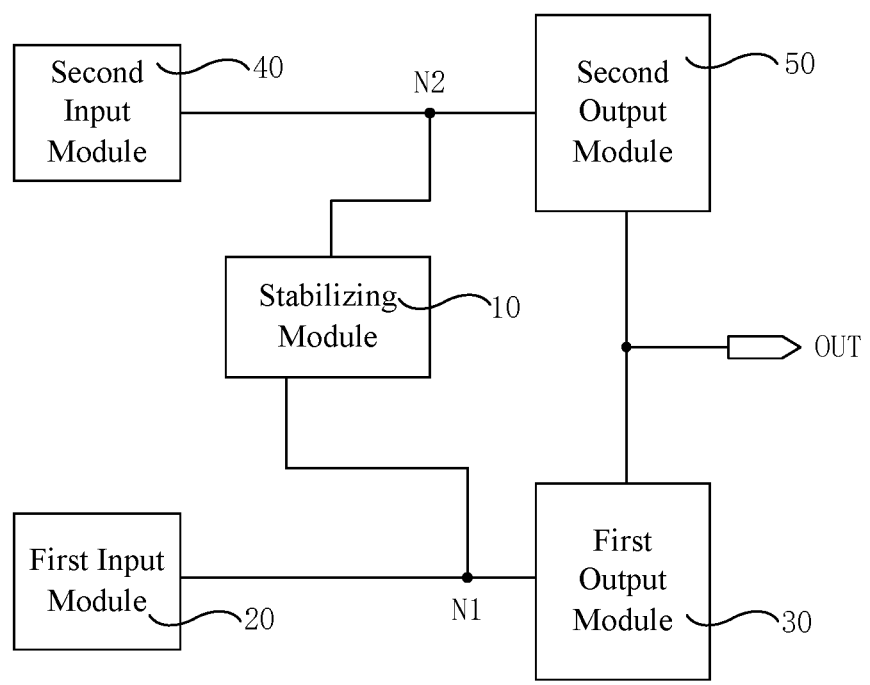
FIG. 1 is a structural schematic diagram of a shift register unit according to an embodiment of the present disclosure.

An embodiment of the present disclosure provides a shift register unit. As shown in FIG. 1, the shift register unit includes a stabilizing circuit 10, a first input circuit 20, a first output circuit 30, a second input circuit 40, and a second output circuit 50.

The first input circuit 20 is connected to a first node N1. The first input circuit 20 is used to output a potential signal to the first node N1.

Figure 2:
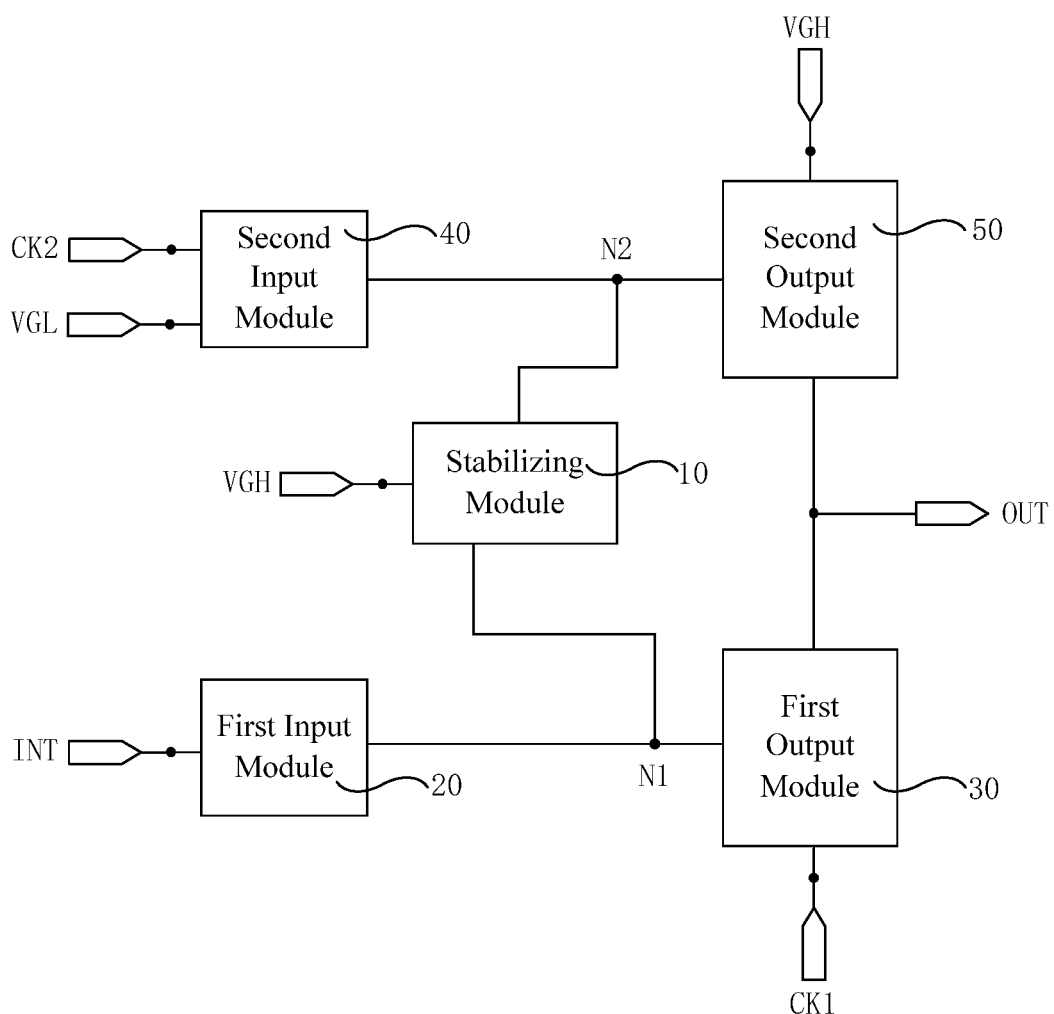
FIG. 2 is a structural schematic diagram of another shift register unit according to an embodiment of the present disclosure.

Optionally, for example, as shown in FIG. 2, when the first input circuit 20 is connected to a signal input terminal INT, the first input circuit 20 is used to, under the control of the signal input terminal INT, output a signal of the signal input terminal INT to the first node N1.

The first output circuit 30 is connected to a signal output terminal OUT and the first node N1. The first output circuit 30 is used to, under the control of the first node N1, output a potential signal to the signal output terminal OUT.

Optionally, for example, as shown in FIG. 2, when the first output circuit 30 is further connected to a first clock signal terminal CK1, the first output circuit 30 is configured to, under the control of the first node N1, output a signal of the first clock signal terminal CK1 to the signal output terminal OUT.

The second input circuit 40 is connected to a second node N2. The second input circuit 40 is used to output a signal to the second node N2.

Optionally, for example, as shown in FIG. 2, when the second input circuit 40 is further connected with a second clock signal terminal CK2 and a second voltage terminal VGL, the second input circuit 40 is used to, under the control of the second clock signal terminal CK2, output a signal of the second voltage terminal VGL to the second node N2.

The second output circuit 50 is connected with the signal output terminal OUT and the second node N2. The second output circuit 50 is used to, under the control of the second node N2, output a potential signal to the signal output terminal OUT.

Optionally, for example, as shown in FIG. 2, when the second output circuit 50 is further connected to a first voltage terminal VGH, the second output circuit 50 is used to, under the control of the second node N2, output a signal of the first voltage terminal VGH to the signal output terminal OUT.

The stabilizing circuit 10 is connected with the first node N1 and the second node N2. The stabilizing circuit 10 is used to stabilize a potential of the second node N2 when the first output circuit 30 outputs the potential signal to the signal output terminal OUT such that no signal is outputted from the second output circuit 50; or the stabilizing circuit 10 is used to stabilize a potential of the first node N1 when the second output circuit 50 outputs the potential signal to the signal output terminal OUT, such that no signal is outputted from the first output circuit 30.

Optionally, for example, as shown in FIG. 2, when the stabilizing circuit 10 is further connected to a first voltage terminal VGH, the stabilizing circuit 10 is used to, under the control of the first node N1, output a signal of the first voltage terminal VGH to the second node N2, or, under the control of the second node N2, output the signal of the first voltage terminal VGH to the first node N1.

In this way, on one hand, under the action of the first input circuit 20, the first output circuit 30, the second input circuit 40, and the second output circuit 50 described above, the above shift register unit can shift the signal of the signal input terminal INT, and output the shifted signal through the signal output terminal OUT. Based on this, in a case where a plurality of cascade connected shift register units described above are used to form a gate drive circuit, when a pulse width of a signal outputted from a signal output terminal OUT of a first stage shift register unit is changed, a pulse width of a signal outputted from a signal output terminal OUT of the remaining shift register units will be also changed, so that a pulse width of a signal received by a pixel circuit in each row is changed accordingly. Therefore, when a user's demand for display brightness changes, it is only required to adjust the pulse width of the signal outputted from the signal output terminal OUT of the first stage shift register unit, thereby simplifying the adjusting process.

On the other hand, since the stabilizing circuit 10 of the shift register unit is capable of stabilizing the potentials of the first node N1 and the second node N2, and the first node N1 can control the first output circuit 30 to output a signal to the signal output terminal OUT, and the second node N2 can control the second output circuit 50 to output a signal to the signal output terminal OUT, in this way, when the first output circuit 30 is turned on, the potential of the second node N2 can be stabilized by the stabilizing circuit 10, so as to ensure that no signal is outputted from the second output circuit 50, or when the second output circuit 50 is turned on, the potential of the first node N1 can be stabilized by the stabilizing circuit 10 so as to ensure that no signal is outputted from the first output circuit 30, such that the signal outputted from the signal output terminal OUT is stable.

Specific structures of the respective circuits in FIG. 2 will be described hereinafter in detail.

Figure 3:
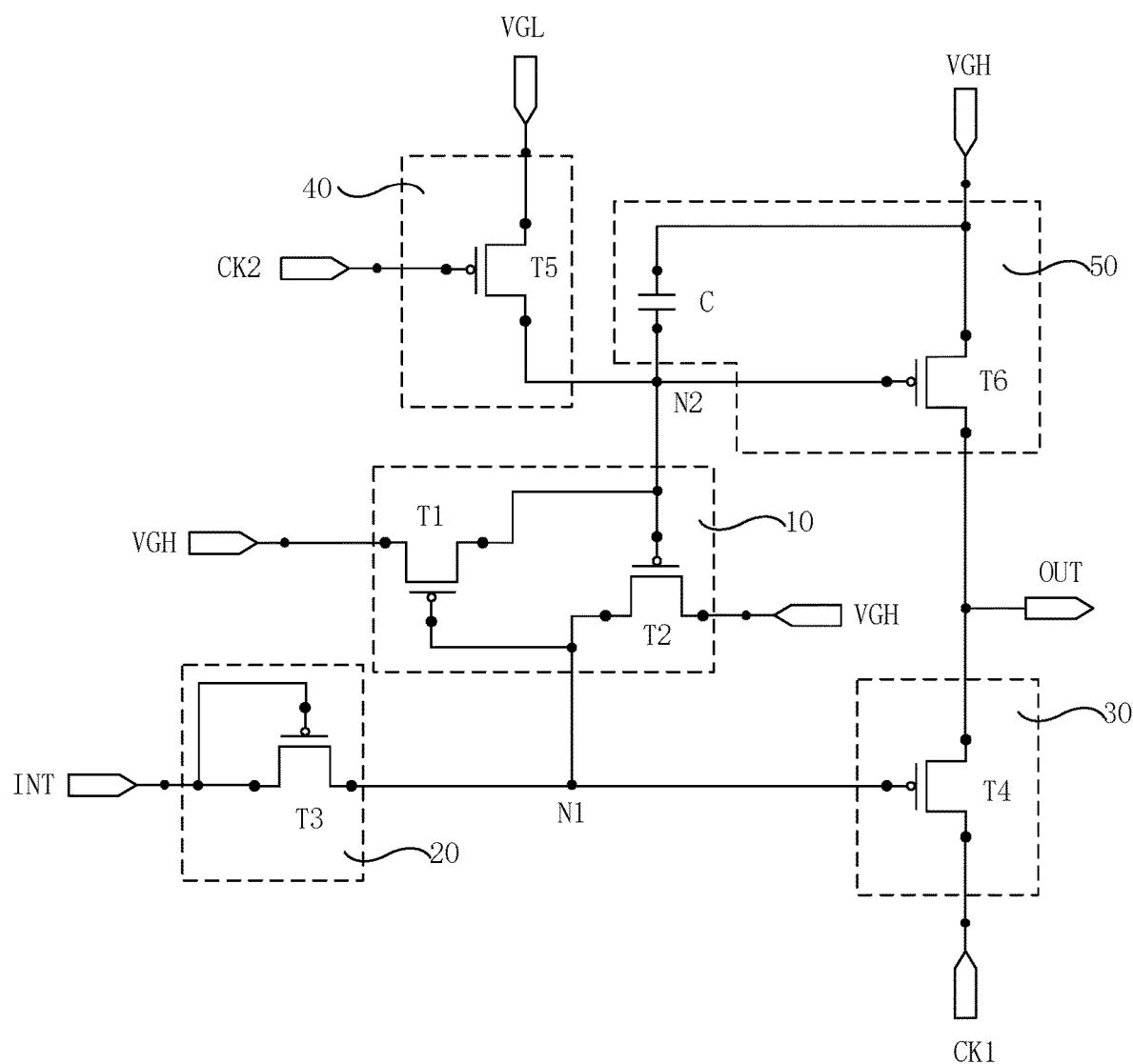
FIG. 3 is a diagram illustrating specific structures of circuits in FIG. 2.

Specifically, as shown in FIG. 3, the stabilizing circuit 10 includes a first transistor T1 and a second transistor T2.

The first transistor T1 has a gate electrode connected to the first node N1, a first electrode connected to a first voltage terminal VGH, and a second electrode connected to the second node N2.

The second transistor T2 has a gate electrode connected to the second node N2, a first electrode connected to a first voltage terminal VGH, and a second electrode connected to the first node N1.

In this case, the first transistor T1 and the second transistor T2 can be interlocked. An example is taken where both the first transistor T1 and the second transistor T2 are P-type transistors, and the first voltage terminal VGH outputs a high level, when the first transistor T1 is turned on, the high level outputted by the above first voltage terminal VGH is outputted to the gate electrode of the second transistor T2 through the first transistor T1 so that the second transistor T2 is in an off-state. Alternatively, when the second transistor T2 is turned on, the high level outputted by the above first voltage terminal VGH is outputted to the gate electrode of the first transistor T1 through the second transistor T2, so that the first transistor T1 is in an off-state.

In addition, an aspect ratio of the first transistor T1 is greater than an aspect ratio of the second transistor T2. In this way, an output capacity of the first transistor T1 is greater than an output capacity of the second transistor T2, so that when the gate electrodes of the first transistor T1 and the second transistor and T2 are both at a low level, the turning-on of the first transistor T1 may be prior to the turning-on of the second transistor T2.

In addition, the first input circuit 20 includes a third transistor T3, a gate electrode and a first electrode of the third transistor T3 are connected to the signal input terminal INT, and a second electrode of the third transistor T3 is connected to the first node N1.

The first output circuit 30 includes a fourth transistor T4 having a gate electrode connected to the first node N1, a first electrode connected to the first clock signal terminal CK1, and a second electrode connected to the signal output terminal OUT.

The second input circuit 40 includes a fifth transistor T5, which has a gate electrode connected to the second clock signal terminal CK2, a first electrode connected to the second voltage terminal VGL, and a second electrode connected to the second node N2.

The second output circuit 50 includes a sixth transistor T6 and a storage capacitor C.

The sixth transistor T6 has a gate electrode connected to the second node N2, a first electrode connected to the first voltage terminal VGH, and a second electrode connected to the signal output terminal OUT.

One terminal of the storage capacitor C is connected to the first voltage terminal VGH, and the other terminal is connected to the second node N2.

Figure 4:
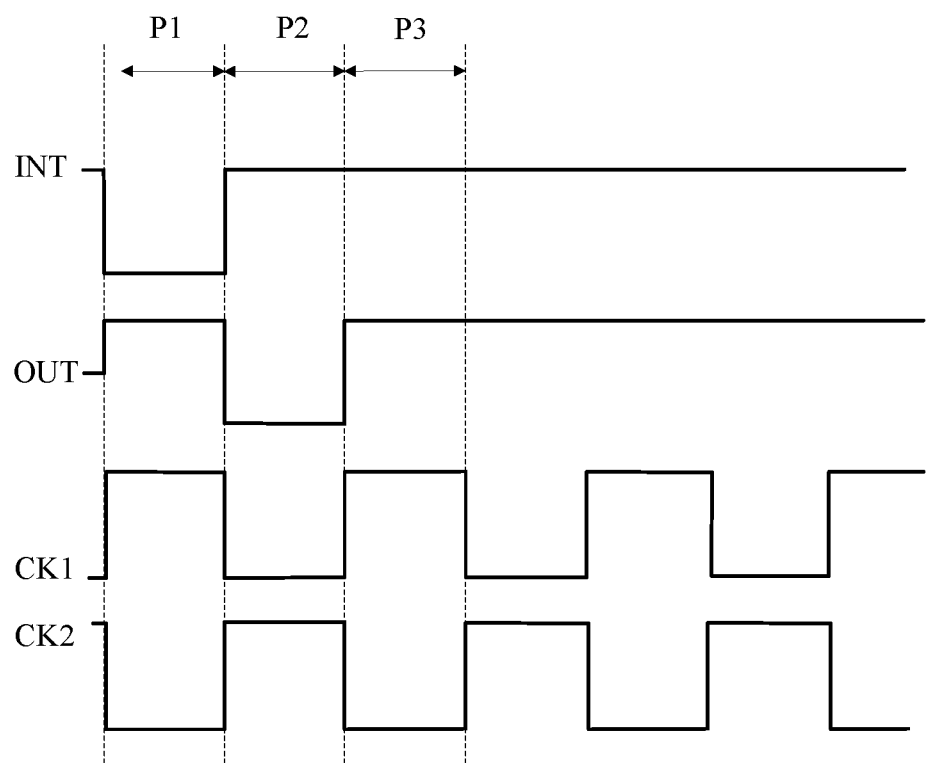
FIG. 4 is a timing diagram illustrating various control signals for controlling the shift register unit shown in FIG. 3.

It should be noted that, the above-described transistors may be P-type transistors. In this case, the above second voltage terminal VGL is inputted with a constant low level, and the first voltage terminal VGH is inputted with a constant high level. The remaining signal terminals are inputted with signals as shown in FIG. 4. Alternatively, the above-described transistors may also be N-type transistors. In this case, it is necessary to invert the signals inputted in the respective signal terminals in FIG. 4.

In addition, the first electrodes of the above-described transistors are source electrodes, and the second electrodes thereof are drain electrodes. Alternatively, the first electrodes are drain electrodes, and the second electrodes are source electrodes.

Hereinafter, an example is taken where the transistors in FIG. 3 are P-type transistors, and an on-state and an off-state of the respective transistors in various phases in an image frame will be described in detail with reference to FIG. 4. In the present disclosure, the first voltage terminal VGH outputs a constant high level, for example, 7V, and the second voltage terminal VGL outputs a constant low level, for example, −7V. Transistors of a pixel circuit connected to the shift register unit are generally P-type transistors.

During a first phase P1 of an image frame, INT=0, CK1=1, CK2=0, and OUT=1. In this application, "1" indicates a high level, and "0" indicates a low level.

In this case, a low level is inputted to the signal input terminal INT, the third transistor T3 is turned on, and the low level of the signal input terminal INT is outputted to the first node N1 through the above-mentioned third transistor T3. Under the control of the first node N1, the fourth transistor T4 is turned on, and outputs a high level outputted from the first clock signal terminal CK1 to the signal output terminal OUT.

Furthermore, a low level is inputted at the second clock signal terminal CK2, the fifth transistor T5 is turned on, and the low level of the second voltage terminal VGL is outputted to the second node N2 through the above-described fifth transistor T5. In this case, the gate electrodes of the first transistor T1 and the second transistor T2 are both at a low level. Because the aspect ratio of the first transistor T1 is greater than the aspect ratio of the second transistor T2, the turning-on of the first transistor T1 is prior to the turning-on of the second transistor T2. In this way, when the first transistor T1 is turned on, the high level of the first voltage terminal VGH is outputted to the second node N2 through the first transistor T1 so that the second node N2 is at a high level. At this time, under the control of the second node N2, the sixth transistor T6 and the second transistor T2 remain in an off-state.

In this way, the sixth transistor T6 is turned off by the interlocking of the first transistor T1 and the second transistor T2 described above, so that the signal output terminal OUT receives only the signal outputted from the first clock signal terminal CK1.

During a second phase P2 of an image frame, INT=1, CK1=0, CK2=1, and OUT=0.

In this case, a high level is inputted at the signal input terminal INT, and the third transistor T3 is turned off. Generally, an aspect ratio of the fourth transistor T4 is greater, thus a parasitic capacitance of the fourth transistor T4 itself will be continuously kept at a low level stored in the previous phase, in this way, the first node N1 is at a low level. Based on this, the fourth transistor T4 may be kept in an on-state and output a low level of the first clock signal terminal CK1 to the signal output terminal OUT.

At this time, a gate line connected to the signal output terminal OUT of the shift register unit receives the low level, uses the low level as a gate drive signal so as to turn on transistors in a pixel circuit connected to the gate line.

On this basis, under the control of the first node N1, the first transistor T1 is turned on, and the high level of the first voltage terminal VGH is outputted to the second node N2. At this time, the second node N2 controls the second transistor T2 and the sixth transistor T6 to be turned off. Therefore, the potential of the second node N2 can be stabilized in this phase by the first transistor T1, so as to not make the potential of the second node N2 unstable, and the sixth transistor T6 is turned on, and the high level of the first voltage terminal VGH is outputted to the signal output terminal OUT by mistake.

During a third phase P3 of an image frame, INT=1, CK1=1, CK2=0, and OUT=1.

In this case, a low level is inputted to the second clock signal terminal CK2, the fifth transistor T5 is turned on, and the low level of the second voltage terminal VGL is outputted to the second node N2, and is stored by the storage capacitor C. At this time, the sixth transistor T6 and the second transistor T2 are turned on. Based on this, the high level of the first voltage terminal VGH is outputted to the signal output terminal OUT through the sixth transistor T6. In addition, the second transistor T2 is turned on, and the high level of the first voltage terminal VGH is outputted to the first node N1. At this time, the first transistor T1 and the fourth transistor T4 are turned off. Thus, the potential of the first node N1 can be stabilized in this phase by the second transistor T2.

In summary, only in the second phase P2, the signal output terminal of the shift register unit outputs a low level, thereby turning on a transistor in the pixel circuit connected to the signal output terminal OUT of the shift register unit.

In addition, before a next image frame, that is, before a low level is outputted from the signal input terminal INT again, by discharge of the storage capacitor C and under the control of the second clock signal terminal CK2, the sixth transistor T6 is kept in an on-state, so that the signal output terminal OUT remains in a high level output state.

Figure 5:
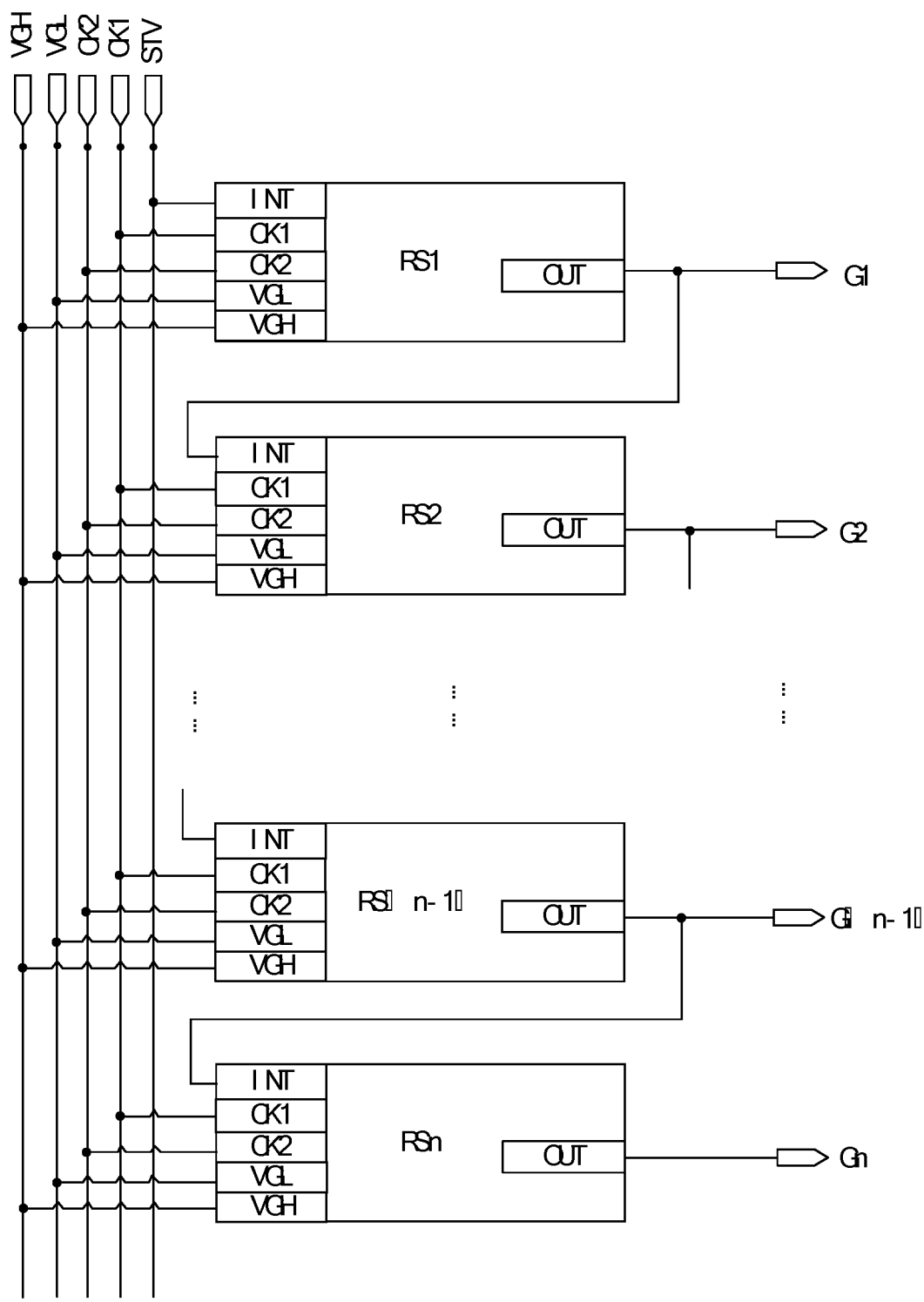
FIG. 5 is a structural schematic diagram of a gate drive circuit formed by using a plurality of shift register units as shown in FIG. 2 or FIG. 3.

An embodiment of the present disclosure provides a gate drive circuit which, as shown in FIG. 5, includes a plurality of cascaded connected of any of the shift register units (RS1, RS2, . . . , RS(n−1), RSn) as described above, connected to gate lines (G1, G2, . . . , G(n−1), Gn) respectively. Wherein n is a positive integer greater than two.

A signal input terminal INT of a first stage shift register unit RS1 is connected to an initiating signal terminal STV. The signal input terminal of the first stage shift register unit RS1 is connected to the initiating signal terminal STV. The initiating signal terminal STV is used to input an initiating signal, so that a gate drive circuit which receives the initiating signal starts to work.

Except for the first stage shift register unit RS1, a signal output terminal OUT of a previous stage shift register unit is connected to a signal input terminal INT of a next stage shift register unit.

It should be noted that the shift register units constituting the above-described gate drive circuit have the same structure and advantageous effects as those of the shift register units provided in the embodiments described above. Because the structure and advantageous effects of the shift register units have been described in detail in the embodiments described above, it will not be elaborated herein.

An embodiment of the present disclosure provides a display device including any of the gate drive circuits described above, the display device has the same structure and advantageous effects as those of the gate drive circuit provided by the foregoing embodiments. Since the structure and advantageous effects of the gate drive circuit have been described in detail in the foregoing embodiments, it will not be elaborated herein.

In an embodiment of the present disclosure, the display device may specifically include at least a liquid crystal display device and an organic light emitting diode display device. For example, the display device may be any product or part having a display function such as a liquid crystal display, a liquid crystal television, a digital photo frame, a mobile phone, or a tablet computer. The detailed structure of the array substrate has been described in detail in the foregoing embodiments, which will not be elaborated herein.

An embodiment of the present disclosure provides a method for driving a shift register unit. A method for driving the shift register unit in an image frame includes the following steps:

During the first phase P1 of an image frame, the first input circuit 20 outputs a signal to the first node N1. Under the control of the first node N1, the first output circuit 30 outputs a first signal to the signal output terminal OUT. The stabilizing circuit 10 stabilizes a potential of the second node N2 so that no signal is outputted from the second output circuit 50. The above first signal and second signal are respectively at a high level and a low level, or vice versa. When a transistor of a pixel circuit connected to the shift register unit is a P-type transistor, the above first signal is at a high level and the second signal is at a low level. Hereinafter, for convenience of explanation, an example is taken in which the transistor of the pixel circuit connected to the shift register unit is a P-type transistor.

Optionally, for example, as shown in FIG. 2, when the first input circuit 20 is further connected to the signal input terminal INT, the first input circuit 20 outputting a signal to the first node N1 includes: the first input circuit 20 outputting a signal of the signal input terminal INT to the first node N1 under the control of the signal input terminal INT.

In addition, when the first output circuit 30 is further connected to the first clock signal terminal CK1, the first output circuit 30 outputting a signal to the signal output terminal OUT includes the first output circuit 30 outputting a signal of the first clock signal terminal CK1 to the signal output terminal OUT.

Specifically, when the stabilizing circuit 10 includes a first transistor T1 and a second transistor T2, as shown in FIG. 3. The first input circuit 10 includes a third transistor T3, and the first output circuit includes a fourth transistor. The second input circuit 40 includes a fifth transistor T5. The second output circuit 50 includes a sixth transistor T6 and a storage capacitor C. In the case where the above-mentioned transistors are all P-type transistors, in the above-mentioned first phase P1:

A low level is inputted to the signal input terminal INT, the third transistor T3 is turned on, and the low level of the signal input terminal INT is outputted to the first node N1 through the above-mentioned third transistor T3. Under the control of the first node N1, the fourth transistor T4 is turned on, and outputs a high level outputted from the first clock signal terminal CK1 to the signal output terminal OUT.

Furthermore, a low level is inputted at the second clock signal terminal CK2, the fifth transistor T5 is turned on, and the low level of the second voltage terminal VGL is outputted to the second node N2 through the above-described fifth transistor T5. In this case, the gate electrodes of the first transistor T1 and the second transistor T2 are both at a low level. Because the aspect ratio of the first transistor T1 is greater than the aspect ratio of the second transistor T2, the turning-on of the first transistor T1 is prior to the turning-on of the second transistor T2. In this way, when the first transistor T1 is turned on, the high level of the first voltage terminal VGH is outputted to the second node N2 through the first transistor T1 so that the second node N2 is at a high level. At this time, under the control of the second node N2, the sixth transistor T6 and the second transistor T2 remain in an off-state.

In this way, the sixth transistor T6 is turned off by the interlocking of the first transistor T1 and the second transistor T2 described above, so that the signal output terminal OUT receives only the signal outputted from the first clock signal terminal CK1.

During a second phase P2 of an image frame, the first output circuit 30 maintains in an ON-state and outputs a second signal to the signal output terminal OUT. The stabilizing circuit 10 stabilizes the potential of the second node N2 so that no signal is outputted from the second output circuit 50.

Specifically, a high level is inputted at the signal input terminal INT, and the third transistor T3 is turned off. Generally, an aspect ratio of the fourth transistor T4 is greater, thus a parasitic capacitance of the fourth transistor T4 itself will be continuously kept at a low level stored in the previous phase, in this way, the first node N1 is at a low level. Based on this, the fourth transistor T4 may be kept in an on-state and output a low level of the first clock signal terminal CK1 to the signal output terminal OUT. At this time, a gate line connected to the signal output terminal OUT of the shift register unit receives the above low level, so as to turn on a transistor in a pixel circuit connected to the gate line.

On this basis, under the control of the first node N1, the first transistor T1 is turned on, and the high level of the first voltage terminal VGH is outputted to the second node N2. At this time, the second node N2 controls the second transistor T2 and the sixth transistor T6 to be turned off. Therefore, the potential of the second node N2 can be stabilized in this phase by the first transistor T1, so as to not make the potential of the second node N2 unstable, and the sixth transistor T6 is turned on, and the high level of the first voltage terminal VGH is outputted to the signal output terminal OUT by mistake.

During a third phase P3 of an image frame, the second input circuit 40 outputs a signal to the second node N2. Under the control of the second node N2, the second output circuit 50 outputs a first signal to the signal output terminal OUT. The stabilizing circuit 10 stabilizes the potential of the first node N1 so that no signal is outputted from the first output circuit 30.

Optionally, for example, as shown in FIG. 2, when the second input circuit 40 is further connected to the second clock signal terminal CK2 and the second voltage terminal VGL, the second input circuit 40 outputting a signal to the second node N2 includes: the second input circuit 40 outputting the signal of the second voltage terminal VGL to the second node N2 under the control of the second clock signal terminal CK2.

When the second output circuit 50 is further connected to the first voltage terminal VGH, the second output circuit 50 outputting a signal to the signal output terminal OUT includes the second output circuit 50 storing the potential of the second node N2 and outputting the signal of the first voltage terminal VGH to the signal output terminal OUT, under the control of the second node N2.

In addition, when the stabilizing circuit 10 is further connected to the first voltage terminal VGH, the stabilizing circuit 10 stabilizing the potential of the first node N1 or the second node N2 includes: under the control of the first node N1, the stabilizing circuit 10 outputting the signal of the first voltage terminal VGH to the second node N2; or under the control of the second node N2, the stabilizing circuit 10 outputting the signal of the first voltage terminal VGH to the first node N1.

In addition, a low level is inputted to the second clock signal terminal CK2, the fifth transistor is turned on, and the low level of the second voltage terminal VGL is outputted to the second node N2, and is stored by the storage capacitor C. At this time, the sixth transistor T6 and the second transistor T2 are turned on. Based on this, the high level of the first voltage terminal VGH is outputted to the signal output terminal OUT through the sixth transistor T6. In addition, the second transistor T2 is turned on, and the high level of the first voltage terminal VGH is outputted to the first node N1. At this time, the first transistor T1 and the fourth transistor T4 are turned off. Thus, the potential of the first node N1 can be stabilized in this phase by the second transistor T2.

The foregoing descriptions are merely specific embodiments of the present disclosure, but the protection scope of the present disclosure is not limited thereto, and any person skilled in the art can easily think of variations or replacements within the technical scope disclosed by the present disclosure. Therefore, the protection scope of the present disclosure should be based on the protection scope of the claims.

What is claimed is:
1. A shift register unit comprising:
a first input circuit connected to a first node and configured to output a potential signal to the first node;
a first output circuit connected to a signal output terminal and the first node, and configured to output a potential signal to the signal output terminal under the control of the first node;
a second input circuit connected to a second node, and configured to output a potential signal to the second node;
a second output circuit connected to the signal output terminal and the second node, and configured to output a potential signal to the signal output terminal under the control of the second node; and
a stabilizing circuit connected with the first node and the second node,
wherein the stabilizing circuit is configured to stabilize a potential of the second node when the first output circuit outputs the potential signal to the signal output terminal, so that no signal is outputted from the second output circuit; or
the stabilizing circuit is configured to stabilize a potential of the first node when the second output circuit outputs the potential signal to the signal output terminal, so that no signal is outputted from the first output circuit,
wherein the stabilizing circuit is further connected to a first voltage terminal, and the stabilizing circuit is configured to:
under the control of the first node, output a signal of the first voltage terminal to the second node, or,
under the control of the second node, output a signal of the first voltage terminal to the first node N1;
the stabilizing circuit comprises a first transistor and a second transistor, wherein an aspect ratio of the first transistor is greater than an aspect of the second transistor;
a gate electrode of the first transistor is connected to the first node, a first electrode of the first transistor is connected to the first voltage terminal, and a second electrode of the first transistor is connected to the second node; and
a gate electrode of the second transistor is connected to the second node, a first electrode of the second transistor is connected to the first voltage terminal, and a second electrode of the second transistor is connected to the first node.

2. The shift register unit according to claim 1, wherein the first input circuit is further connected to a signal input terminal, and is configured to, under the control of the signal input terminal, output a potential signal of the signal input terminal to the first node;

the first input circuit comprises a third transistor, a gate electrode and a first electrode of the third transistor are connected to the signal input terminal, and a second electrode of the third transistor is connected to the first node.

3. The shift register unit according to claim 1, wherein the first output circuit is further connected to a first clock signal terminal, and is configured to, under the control of the first node, output a signal of the first clock signal terminal to the signal output terminal;

the first output circuit comprises a fourth transistor, a gate electrode of the fourth transistor is connected to the first node, a first electrode of the fourth transistor is connected to the first clock signal terminal, and a second electrode of the fourth transistor is connected to the signal output terminal.

4. The shift register unit according to claim 1, wherein the second input circuit is further connected with a second clock signal terminal and a second voltage terminal, and is configured to, under the control of the second clock signal terminal, output a signal of the second voltage terminal to the second node;

the second input circuit comprises a fifth transistor, a gate electrode of the fifth transistor is connected to the second clock signal terminal, a first electrode of the fifth transistor is connected to the second voltage terminal, and a second electrode of the fifth transistor is connected to the second node.

5. The shift register unit according to claim 1, wherein the second output circuit is further connected to the first voltage terminal, and is configured to, under the control of the second node, output a signal of the first voltage terminal to the signal output terminal;

the second output circuit comprises a sixth transistor and a storage capacitor;

a gate electrode of the sixth transistor is connected to the second node, a first electrode of the sixth transistor is connected to the first voltage terminal, and a second electrode of the sixth transistor is connected to the signal output terminal;

one terminal of the storage capacitor is connected to the first voltage terminal, and the other terminal of the storage capacitor is connected to the second node.

6. A gate drive circuit comprising a plurality of cascade connected shift register units according to claim 1, wherein a signal input terminal of a first stage shift register unit is connected to an initiating signal terminal;

except for the first stage shift register unit, a signal output terminal of a previous stage shift register unit is connected to a signal input terminal of a next stage shift register unit.

7. A display device comprising the gate drive circuit according to claim 6.

8. A method for driving the shift register unit according to claim 1, wherein the method for driving the shift register unit in an image frame comprises the following steps:

in a first phase, the first input circuit outputs the potential signal to the first node; under the control of the first node, the first output circuit outputs a first signal to the signal output terminal;

the potential of the second node is stabilized by the stabilizing circuit so that no signal is outputted from the second output circuit;

in a second stage, the first output circuit maintains in an ON-state and outputs a second signal to the signal output terminal; the stabilizing circuit stabilizes the potential of the second node so that no signal is outputted from the second output circuit;

in a third stage, the second input circuit outputs the potential signal to the second node; under the control of the second node, the second output circuit outputs the first signal to the signal output terminal; the stabilizing circuit is configured to stabilize the potential of the first node so that no signal is outputted from the first output circuit;

the first signal and the second signal are respectively at a high level and a low level or a low level and a high level.

9. The method for driving the shift register unit according to claim 8, wherein when the stabilizing circuit is further connected to the first voltage terminal, the stabilizing circuit stabilizing the potential of the first node or the second node comprises: under the control of the first node, the stabilizing circuit outputting the signal of the first voltage terminal to the second node; or under the control of the second node, the stabilizing circuit outputting the signal of the first voltage terminal to the first node.

10. The method for driving the shift register unit according to claim 8, wherein when the first input circuit is further connected to a signal input terminal, the first input circuit outputting the potential signal to the first node comprises: the first input circuit outputting a signal of the signal input terminal to the first node under the control of the signal input terminal.

11. The method for driving the shift register unit according to claim 8, wherein when the first output circuit is further connected to the first clock signal terminal, the first output circuit outputting the signal to the signal output terminal comprises: the first output circuit outputting the signal of the first clock signal terminal to the signal output terminal under the control of the first node.

12. The method for driving the shift register unit according to claim 8, wherein when the second input circuit is further connected with the second clock signal terminal and the second voltage terminal, the second input circuit outputting the signal to the second node comprises: outputting the signal of the second voltage terminal to the second node under the control of the second clock signal terminal.

13. The method for driving the shift register unit according to claim 8, wherein when the second output circuit is further connected to the first voltage terminal, the second output circuit outputting a signal to the signal output terminal comprises the second output circuit storing the potential of the second node and outputting the signal of the first voltage terminal to the signal output terminal, under the control of the second node.

14. The method for driving the shift register unit according to claim 8, wherein when the stabilizing circuit is further connected to the first voltage terminal, the first input circuit is further connected to the signal input terminal, the first output circuit is further connected to the first clock signal terminal, the second input circuit is further connected to the second clock signal terminal and the second voltage terminal, the second output circuit is further connected to the first voltage terminal; and when the stabilizing circuit comprises the first transistor and the second transistor, the first input circuit comprises the third transistor, the first output circuit comprises the fourth transistor, the second input circuit comprises the fifth transistor, and the second output circuit comprises the sixth transistor and the storage capacitor; and in the case where the above-described transistors are all P-type transistors, the method for driving the shift register unit in an image frame comprises: the second voltage terminal being inputted with a low level, and the first voltage terminal being inputted with a high level;

in the first phase, the signal input terminal and the second clock signal terminal are inputted with a low level, and the first clock signal terminal is inputted with a high level;

the fourth transistor, the third transistor, the fifth transistor, and the first transistor are turned on, and the remaining transistors are turned off; the signal of the first clock signal terminal is outputted to the signal output terminal through the fourth transistor;

in the second phase, the signal input terminal and the second clock signal terminal are inputted with a high level, and the first clock signal terminal is inputted with a low level;

the fourth transistor and the first transistor are turned on, and the remaining transistors are turned off; the signal of the first clock signal terminal is outputted to the signal output terminal through the fourth transistor;

in the third phase, the signal input terminal and the first clock signal terminal are inputted with a high level, and the second clock signal terminal is inputted with a low level;

the fifth transistor, the second transistor, and the sixth transistor are turned on, and the remaining transistors are turned off; the signal of the first voltage terminal is outputted to the signal output terminal through the sixth transistor.

15. A gate drive circuit comprising a plurality of cascade connected shift register units according to claim 2, wherein a signal input terminal of a first stage shift register unit is connected to an initiating signal terminal;

except for the first stage shift register unit, a signal output terminal of a previous stage shift register unit is connected to a signal input terminal of a next stage shift register unit.

16. A gate drive circuit comprising a plurality of cascade connected shift register units according to claim 3, wherein a signal input terminal of a first stage shift register unit is connected to an initiating signal terminal;

except for the first stage shift register unit, a signal output terminal of a previous stage shift register unit is connected to a signal input terminal of a next stage shift register unit.

17. A gate drive circuit comprising a plurality of cascade connected shift register units according to claim 4, wherein a signal input terminal of a first stage shift register unit is connected to an initiating signal terminal;

except for the first stage shift register unit, a signal output terminal of a previous stage shift register unit is connected to a signal input terminal of a next stage shift register unit.

18. A gate drive circuit comprising a plurality of cascade connected shift register units according to claim 5, wherein a signal input terminal of a first stage shift register unit is connected to an initiating signal terminal;

except for the first stage shift register unit, a signal output terminal of a previous stage shift register unit is connected to a signal input terminal of a next stage shift register unit.

* * * * *